US006274474B1

(12) United States Patent
Caletka et al.

(10) Patent No.: US 6,274,474 B1
(45) Date of Patent: Aug. 14, 2001

(54) METHOD OF FORMING BGA INTERCONNECTIONS HAVING MIXED SOLDER PROFILES

(75) Inventors: David V. Caletka, Apalachin; Eric A. Johnson, Greene, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/426,578

(22) Filed: Oct. 25, 1999

(51) Int. Cl.$^7$ .............................. H01L 21/44; H01L 23/48
(52) U.S. Cl. ..................... 438/613; 438/612; 438/614; 257/738
(58) Field of Search .................................. 438/612, 613, 438/614, 623, 628, 620, 619; 257/738

(56) References Cited

U.S. PATENT DOCUMENTS

| 3,871,014 | 3/1975 | King et al. . | |
|---|---|---|---|
| 3,871,015 | 3/1975 | Lin et al. . | |
| 4,545,610 | 10/1985 | Lakritz et al. . | |
| 5,001,829 | 3/1991 | Schelhorn . | |
| 5,551,627 | * 9/1996 | Leicht et al. ..................... | 228/180.22 |
| 5,583,747 | * 12/1996 | Baird et al. ........................... | 361/767 |
| 5,796,590 | * 8/1998 | Klein ..................................... | 361/774 |
| 5,859,407 | * 1/1999 | Saiki et al. ........................... | 212/209 |
| 5,894,173 | * 4/1999 | Jacobs et al. ......................... | 257/790 |
| 5,930,597 | * 7/1999 | Call et al. ............................. | 438/106 |
| 6,012,626 | * 1/2000 | Antao .................................... | 228/254 |

OTHER PUBLICATIONS

V.D. Van Vestrout, IBM Technical Disclosure Bulletin, "Floating Backbond Mounting for a Chip Device," vol. 16, No. 3, Aug. 1973, p. 766.
IBM Technical Disclosure Bulletin, "Chip Support Assembly," Sep. 1976, pp. 1178–1179.
IBM Technical Disclosure Bulletin, "Repeatable, Reliable and Inexpensive Method of Flip–Flop Chip Bond Extension," Jul. 1980, pp. 575–576.
IBM Technical Disclosure Bulletin, "Interface Array Connector System," Jul. 1974, p. 627.
IBM Technical Disclosure Bulletin, "POS Register Definition Architected for up to 8 Simms," Mar. 1990, pp. 118–119.
"High Performance Carrier Technology: Materials And Fabrication", by Light et al, 1993 International Electronics Packaging Conference, San Diego, California, vol. one.
"High Performance Carrier Technology", by Heck et al, 1993 International Electronics Packaging Conference, San Diego, California, vol. one.
"Process Considerations in the Fabrication of Teflon Printed Circuit Boards", by Light et al, 1994 Proceedings, 44 Electronic Components & Technology Conference, 5/94.

* cited by examiner

Primary Examiner—Chandra Chaudhari
Assistant Examiner—Brook Kebede
(74) Attorney, Agent, or Firm—Schmeiser, Olsen & Watts; Lawrence R. Fraley

(57) ABSTRACT

A method of forming BGA interconnections having improved fatigue life is disclosed. In particular, a combination of mask-defined and pad-defined solder joints are selectively positioned within the BGA package. The mask-defined solder joints possess a high equilibrium height, which forces the pad-defined solder joints to elongate, thereby making the pad-defined solder joints more compliant. Further, the pad-defined solder joints posses a slightly longer fatigue life because the stress concentrations found in the mask-defined solder joints are not present in the pad-defined solder joints. Therefore, the fatigue life of BGA packages is increased by implementing a majority of mask-defined solder joints to maintain a high equilibrium height, and selectively placing pad-defined solder joints in high stress areas of the BGA package.

18 Claims, 8 Drawing Sheets

METHOD OF FORMING BGA INTERCONNECTIONS HAVING MIXED SOLDER PROFILES

BACKGROUND OF THE INVENTION

1. Technical Field

The present invention relates generally to Ball Grid Array (hereinafter "VGA") packages. More particularly, the present invention relates to a method of forming interconnections having mixed solder joint profiles within BGA packages to increase fatigue life of the BGA interconnections.

2. Related Art

In the manufacture of BGA packages, differences in the coefficients of thermal expansion between a chip carrier or module and a board creates stresses, in particular, shear stress, within the interconnections, or solder joints. The stresses are typically the highest in the solder joints at the corners of the BGA package, and in the solder joints directly beneath the corners and edges of the chip. Frequently, the solder joints in these regions cannot withstand the stresses applied over many on/off cycles, resulting in fatigue failure of the BGA solder joints. It is well known that elongating the solder joints will extend the fatigue life. It was determined that elongated solder joints are more compliant and have lower shear stress than when compared to shorter solder joints having the same volume.

Several techniques have been used in the industry to produce elongated solder joints. For instance, spacers, high-melt solder columns, and other additional materials, have been placed between the module and the board to force the solder joints to elongate. Lifting forces have been applied to the BGA packages during solidification to extend the solder joints. Solder joints having increased volume have been placed at selected locations within the package thereby forcing the other solder joints to elongate, and so on.

However, some of these techniques are incompatible with the trend toward reducing the size of semiconductor packages. Other techniques entail a complicated assembly process which increases manufacturing costs and reduces production yields. Further, some techniques decrease the space on the substrate available for wiring.

Accordingly, there exists a need in the industry for a BGA package exhibiting an increased fatigue life, without increasing the pad size, solder volume, size of the board, etc., or raising the costs.

SUMMARY OF THE INVENTION

The present invention provides a method of forming BGA interconnections, or solder joints, using a combination of mask-defined and pad-defined solder joints to increase fatigue life of the solder joints. In particular, pad-defined solder joints lack the stress concentrations found within the mask-defined solder joints. Therefore, pad-defined solder joints are selectively placed in regions of high stress, particularly at the corners of the BGA package, and directly below the corners and edges of the chip. Mask-defined solder joints are located throughout the remainder of the BGA package to increase the equilibrium height of the pad-defined solder joints, thereby making the pad-defined solder joints more compliant.

The first general aspect of the present invention provides a method of forming Ball Grid Array (BGA) interconnections, comprising the steps of: providing a first substrate and a second substrate, each having a plurality of conductive pads mounted thereon; and applying a first mask to the first substrate and a second mask to the second substrate, wherein a first plurality of openings of the first and second masks expose selected conductive pads and have a diameter larger than a diameter of the conductive pads, and a second plurality of openings of the first and second masks expose selected conductive pads and have a diameter smaller than a diameter of the conductive pads. This aspect allows for a plurality of mask-defined solder joints designed to increase the equilibrium height of pad-defined solder joints. Further, this aspect selectively positions elongated pad-defined solder joints, having no stress concentrations therein, at the high stress regions of the BGA package, thereby increasing the fatigue life of the package.

The second general aspect of the present invention provides a semiconductor package having a series of Ball Grid Array (BGA) interconnections, wherein a plurality of the BGA interconnections are pad-defined solder joints and a plurality of the BGA interconnections are mask-defined solder joints. This aspect allows for similar advantages as those associated with the first aspect.

The third general aspect of the present invention provides a method of forming Ball Grid Array (BGA) interconnections having mixed solder profiles, comprising the steps of: providing a first substrate and a second substrate; applying a mask to at least one of the first and second substrates, wherein a plurality of openings in the mask produces pad-defined solder joints and a plurality of openings in the mask produces mask-defined solder joints. This aspect provides similar advantages as those mentioned with respect to the first aspect.

The fourth general aspect of the present invention provides a substrate having a series of Ball Grid Array (BGA) interconnections, wherein a plurality of the BGA interconnections are pad-defined solder joints and a plurality of the BGA interconnections are mask-defined solder joints. This aspect provides similar advantages as those mentioned with respect to the first aspect.

The fifth general aspect of the present invention provides a solder mask, adapted to be coupled to a substrate having conductive pads thereon, the solder mask having a first plurality of openings and a second plurality of openings, wherein the first plurality of openings are larger than the conductive pads and the second plurality of openings are smaller than the conductive pads. This aspect provides similar advantages as those mentioned with respect to the first aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
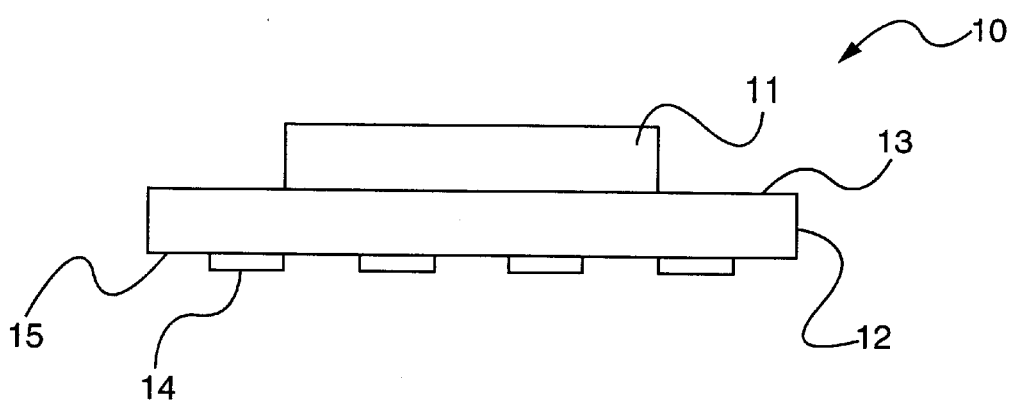
FIG. 1 depicts a cross-sectional view of a module in accordance with a preferred embodiment of the present invention.
Figure 2:
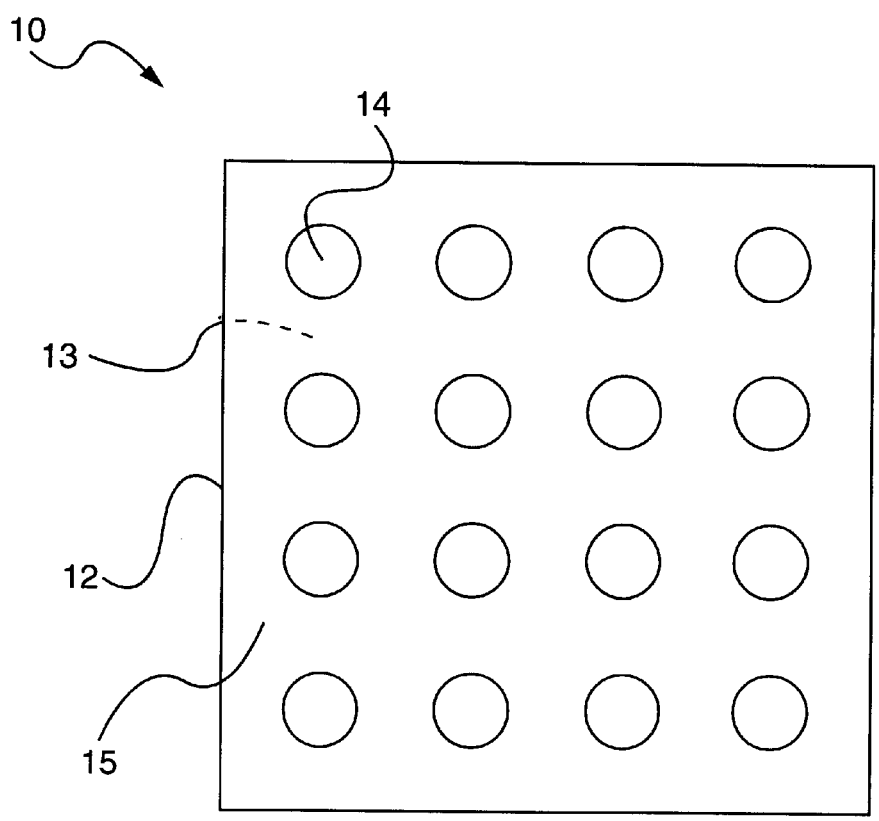
FIG. 2 depicts a surface of the module in FIG. 1.

Referring to the drawings, FIG. 1 shows a cross-sectional view of a module 10. The module 10 has an integrated circuit chip 11 electrically and mechanically connected to a surface 13 of a chip carrier or substrate 12 in a first level assembly process, using a process well known in the art. A plurality of conductive pads 14 are affixed to a surface 15 of the substrate 12 (see also FIG. 2) by a process known in the art. The substrate 12 is preferably a "non-wettable" insulative material, such as ceramic, FR4, IBM's Dry-Clad™, LCP (Liquid Crystal Polymer) polyimide, etc. A non-wettable material is one that solder will not adhere to or "wet" to.

Figure 3:
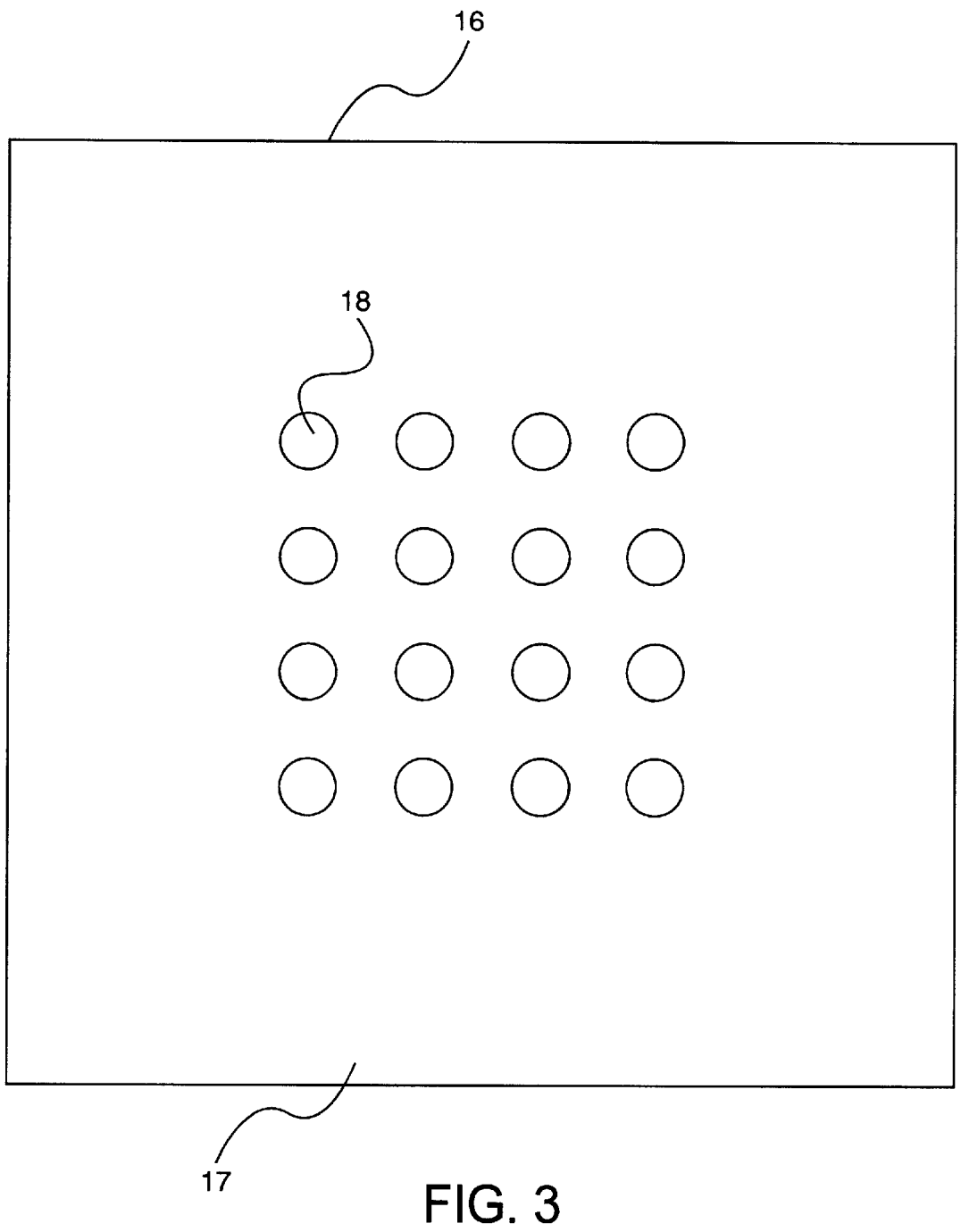
FIG. 3 depicts a printed circuit board in accordance with a preferred embodiment of the present invention.

FIG. 3 shows a printed circuit card or board 16 (second substrate), upon which the module 10 (shown in FIGS. 1 and 2) will be electrically mounted in a second level assembly process. The board 16 is preferably a non-wettable insulative material, i.e., ceramic, FR4, IBM's Dry-Clad™, LCP (Liquid Crystal Polymer) polyimide, etc. The board 16 has a plurality of conductive pads 18 mounted on a surface 17, which correspond with the conductive pads 14 on surface 15 of the module 10 (see FIGS. 1 and 2).

The conductive pads 14, 18 of the module 10 and the board 16 are preferably copper, but may be any other suitable conductive material known and used in the art. The conductive pads 14, 18 of the module 10 and the board 16 are mounted on the surfaces 15, 17 of the substrate 12 and the board 16 using techniques well known in the art. It should be understood that the number an placement of the conductive pads 14, 18 are limited in the accompanying figures only to facilitate a clear explanation of the present invention, and are not intended to be limiting in any way.

Figure 4:
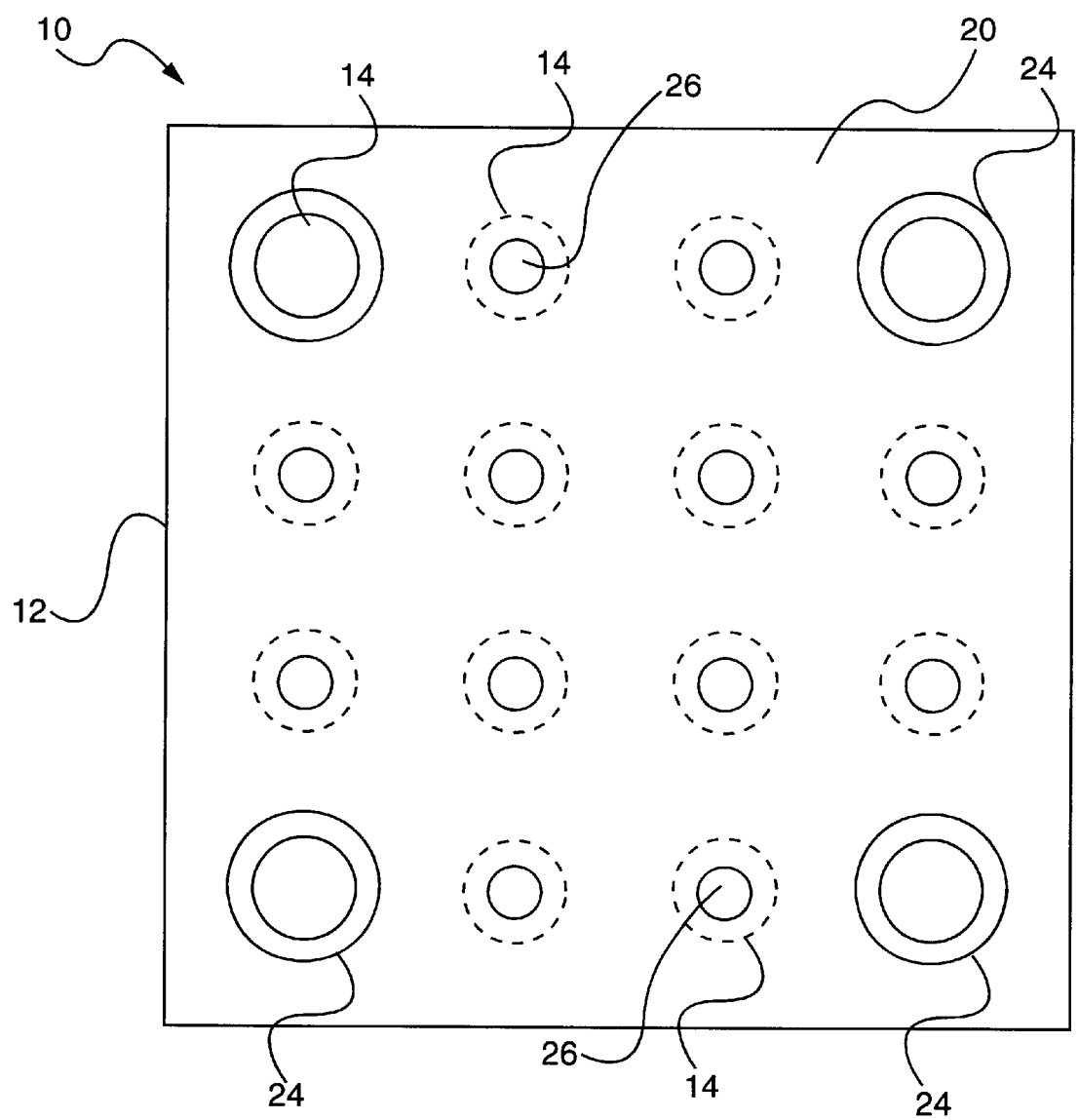
FIG. 4 depicts an enlarged view of the surface of the module in FIG. 2 having a mask thereon in accordance with a preferred embodiment of the present invention.

FIG. 4 shows an enlarged view of the module 10. A mask 20 is applied to the surface 15 (see FIGS. 1 and 2) of the substrate of the module 10 using heat and pressure, or other processes well known in the industry. The mask 20 is made of a non-wettable material, such as an epoxy. The mask 20 covering the surface 15 of the substrate 12 has a plurality of openings 24 and 26 created by a photolithographic process, or other process known and used in the industry, e.g., laser ablation, etc. In this example, the openings 24 within mask 20, located at the corners of the module 10 are larger than the conductive pads 14. In contrast, the openings 26 coinciding with the location of the remaining conductive pads 14, and are smaller than the conductive pads 14 (represented by dashed lines).

Figure 5:
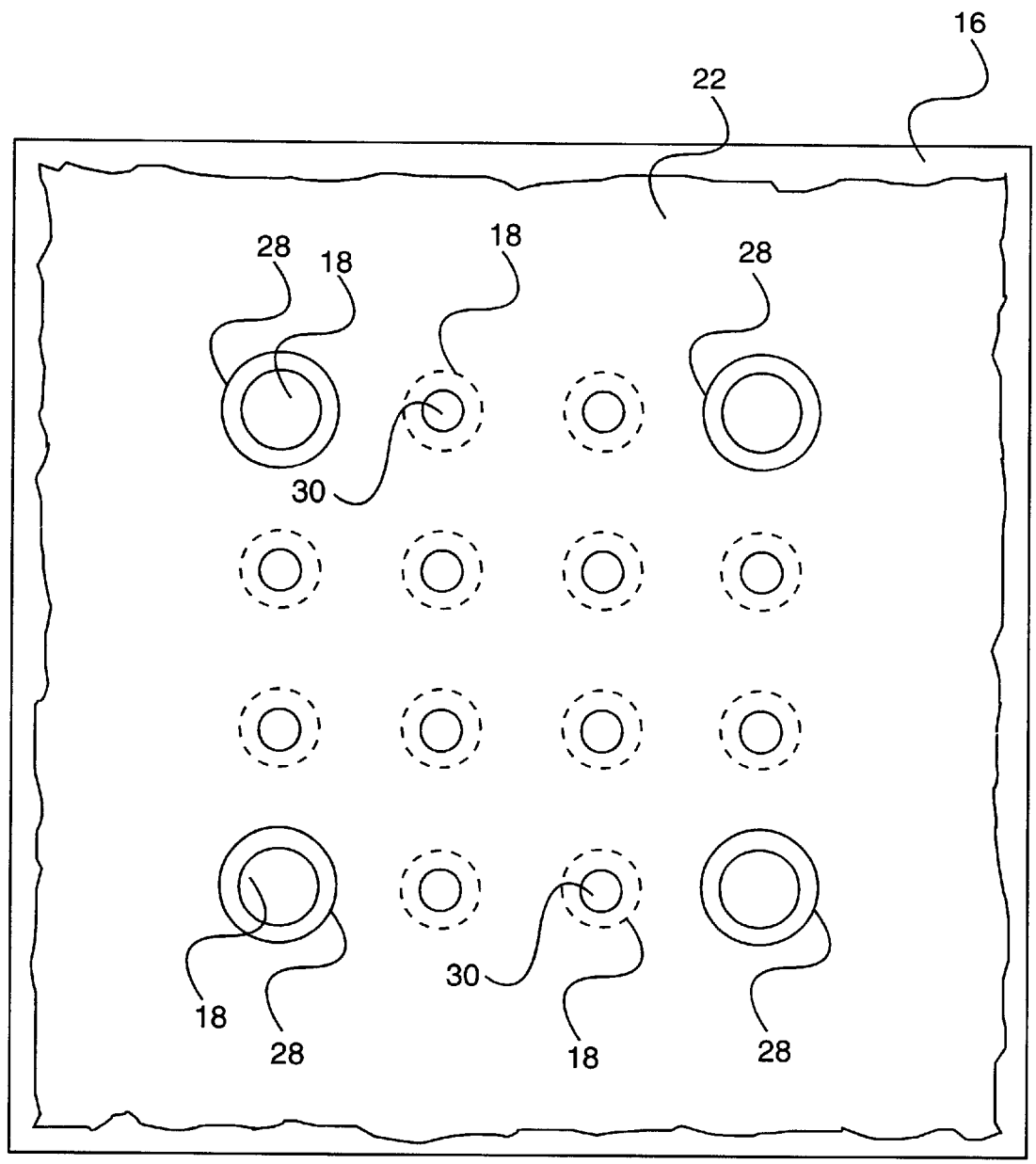
FIG. 5 depicts an enlarged view of the board in FIG. 3 having a mask thereon in accordance with a preferred embodiment of the present invention.

FIG. 5 shows an enlarged view of the board 16. A mask 22 is applied to the surface 17 (see FIG. 3) of the board 16 using heat and pressure, or other processes well known in the industry. The mask 22 is made of a non-wettable material, such as an epoxy. The mask 22 covering the surface 17 of the board 16 has a plurality of openings 28 and 30, which are similar to and coincide with the openings 24, 26 of the mask 20 covering the substrate 12. In this example, the openings 28, located at the corners of the board 16 are larger than the conductive pads 18 of the board 16. The openings 30 coinciding with the location of the remaining conductive pads 18 are smaller than the conductive pads 18.

Figure 6:
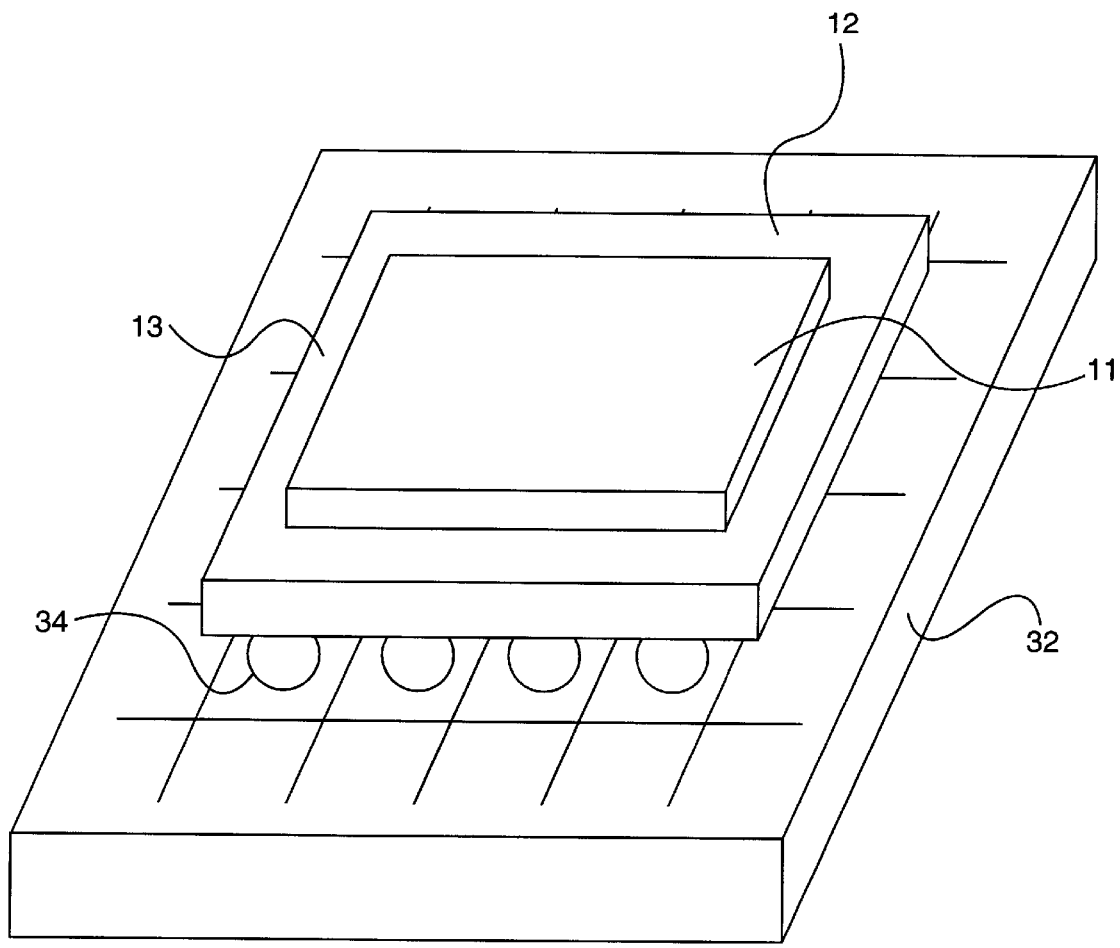
FIG. 6 depicts the module and a graphite frame having solder balls therein in accordance with a preferred embodiment of the present invention.
Figure 7:
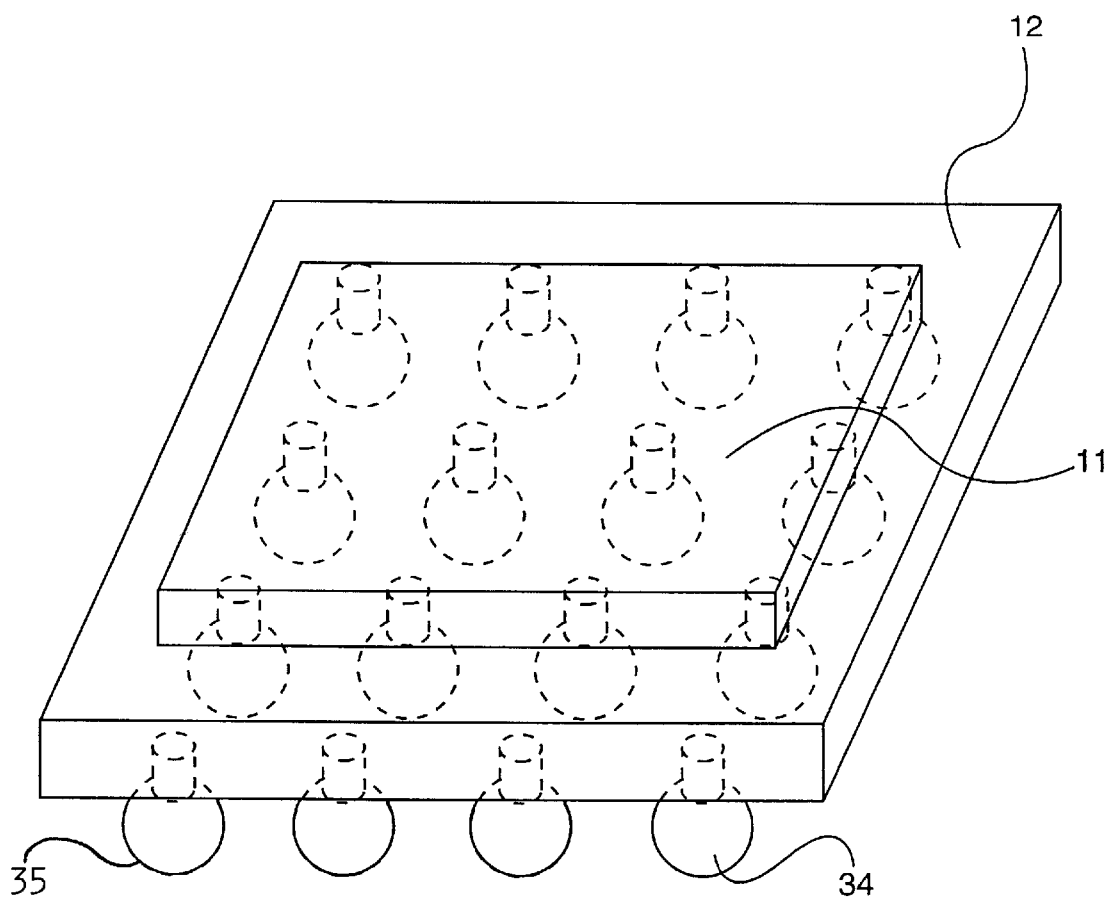
FIG. 7 depicts the module having solder balls wetted thereto in accordance with a preferred embodiment of the present invention.

Solder paste or flux (not shown) is deposited on the conductive pads 14, 18 of the substrate 12 and the board 16 within the openings 24, 26, 28, 30 of the masks 20, 22. The solder paste may be deposited by a screening process, but other known methods may be used. After the solder paste has been deposited, the substrate 12 is placed mask side down in a graphite frame or "boat" 32 (shown in FIG. 6). The boat 32 contains solder balls 34, each having the same diameter and volume. Heat is applied such that the solder balls 34 begin to soften and wet onto the surfaces of the conductive pads 14 exposed by the openings 24, 26 of the mask 20. In particular, the solder balls 34 will adhere to or wet to the entire conductive pad 14 in regions of the substrate 12 exposed by opening 24. Whereas, in regions of the substrate 12 in which the conductive pad 14 is exposed by opening 26, the wettable area is limited to the size of the opening 26 (which is less than the size of the conductive pad 14), rather than the entire conductive pad 14. The temperature is reduced causing the solder balls 34 to solidify. The module 10, having solder balls 34 attached to the substrate 12, is removed from the boat 32, and is illustrated in FIG. 7.

The module 10 is then placed on the board 16, such that the conductive pads 18 of the board 16 are aligned with the corresponding conductive pads 14 of the substrate 12. Heat is again applied causing a free end 35 (see FIG. 7) of the solder balls 34 to wet onto the wettable areas of the board 16, i.e, the surfaces of the conductive pads 18 that are exposed by the openings 28, 30 of the mask 22.

Figure 8:
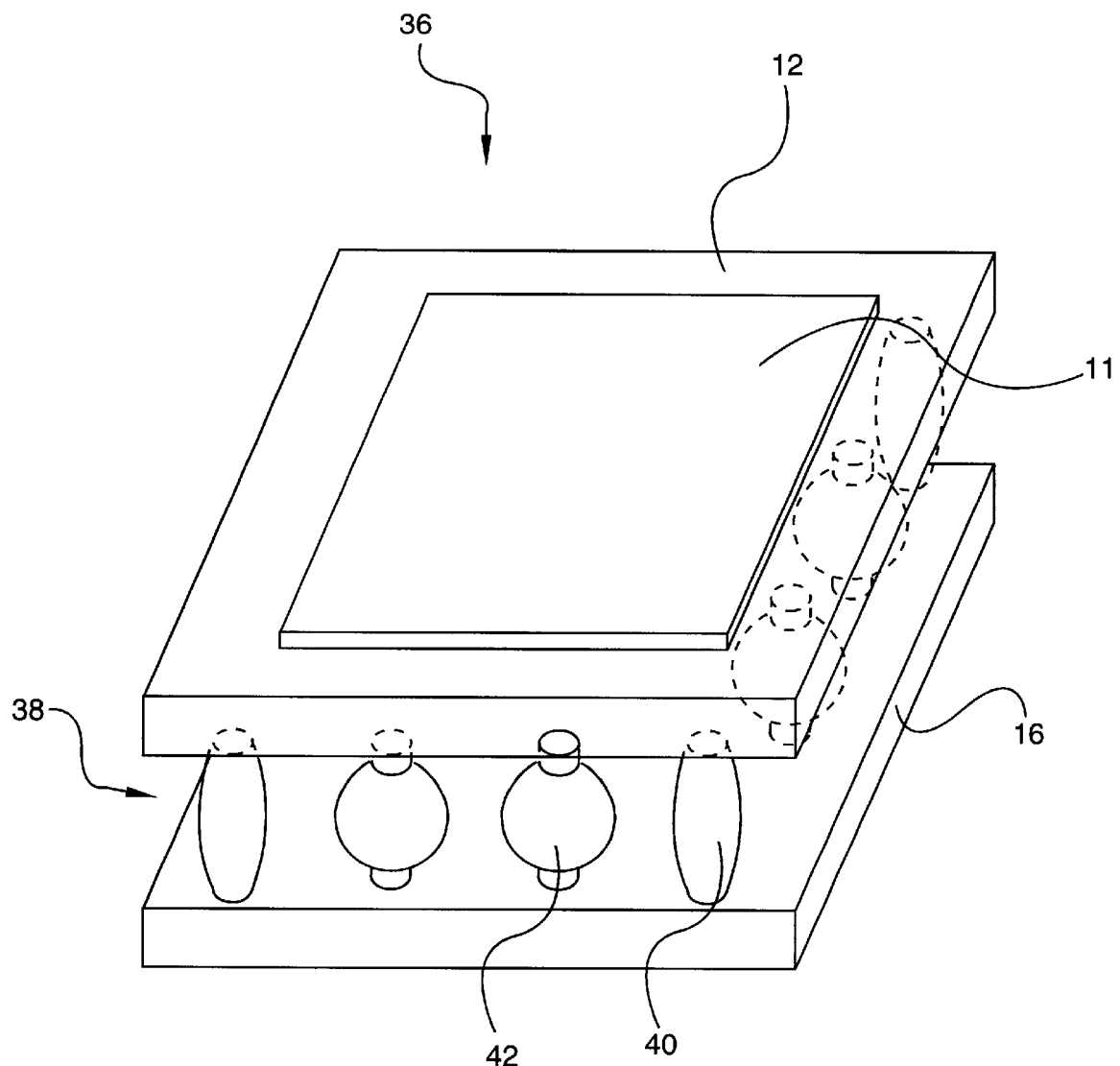
FIG. 8 depicts a BGA package having mixed profile interconnections in accordance with a preferred embodiment of the present invention.

FIG. 8 shows a BGA package 36 formed after the solder balls 34 (shown in FIG. 7) wet onto the wettable areas of the conductive pads 18 of the board 16. It should be understood that in this example the wettable areas of the board 16 correspond to and are similar to the wettable areas of the substrate 12. The BGA package 36 has a plurality of interconnections or solder joints 38 which connect the module 10 to the board 16. Pad-defined solder joints 40 are selectively placed at the high stress areas of the BGA package 36, in this example at the corners, while mask-defined solder joints 42 are located therebetween.

Figure 9:
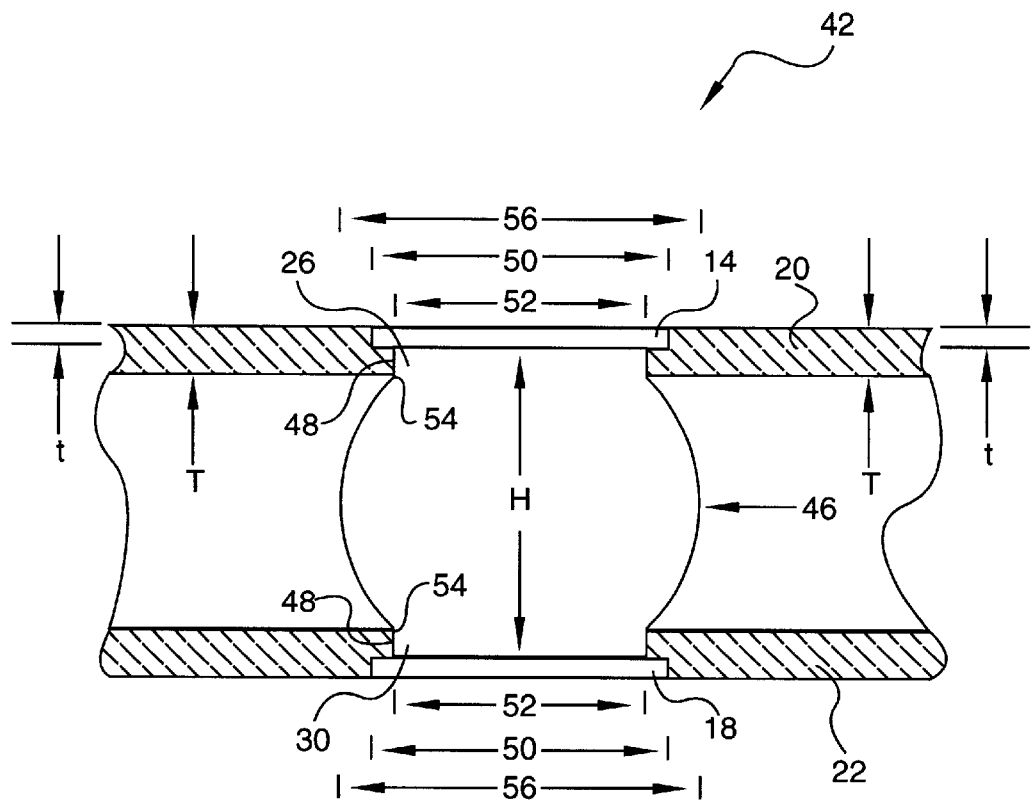
FIG. 9 depicts a cross-sectional view of a mask-defined solder joint in accordance with a preferred embodiment of the present invention.

FIG. 9 shows a cross-sectional view of a mask-defined solder joint 42, having a diameter 56. The masks 20, 22 partially covering the conductive pads 14, 18 have a thickness T greater than the thickness t of the conductive pads 14, 18. Further, the openings 26, 30 of the masks 20, 22 have diameters 52 smaller than the diameters 50 of the conductive pads 14, 18. These conductive pads 14, 18, partially covered by the masks 20, 22 are referred to as "captured" pads. Captured pads have a wettable area defined by the diameter 52 of the openings 26, 30 in the masks 20, 22, rather than by the diameter 50 of the conductive pads 14, 18. As a result, the amount of solder that wets to the conductive pads 14, 18 in a mask-defined solder joint 42 is reduced. Captured pads develop a collar or cylindrical portion 48 at the top and bottom of the solder joint 42. The cylindrical portion 48 at each end of the mask-defined solder joint 42 increases the equilibrium height H of the solder joint 42. Equilibrium height of a solder joint is the natural height achieved as the solder wets to the conductive pads and forces the module 10 and the board 16 farther apart, or the height at which the pressure within solder acting on the contact area of the pad balances the weight of the BGA package applied to that solder joint. This is true because the height of a truncated sphere is increased as the diameter of its base is decreased.

Figure 10:
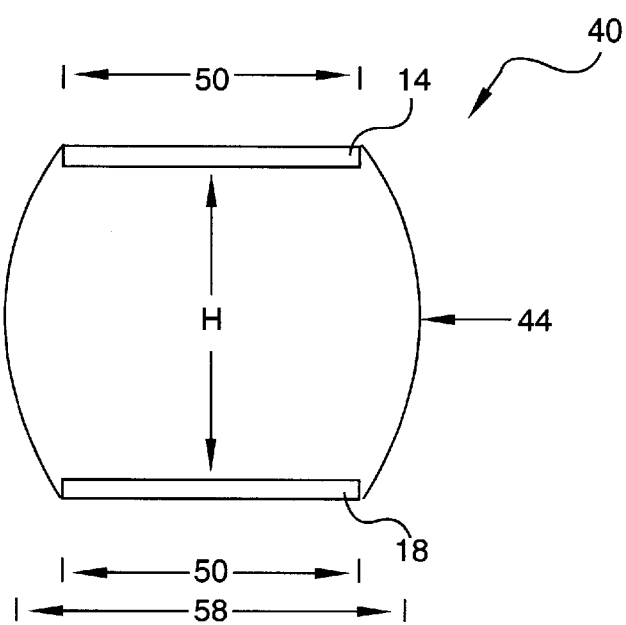
FIG. 10 depicts a cross-sectional view of a pad-defined solder joint in accordance with a preferred embodiment of the present invention.

FIG. 10 shows a cross-sectional view of a pad-defined solder joint 40, having a diameter 58 (which is slightly less than the diameter 56 of the mask-defined solder joint). These "uncaptured pads" (the wettable area is not limited by the diameter of the mask opening) have a wettable area defined by the diameter 50 of the conductive pads 14, 18. The solder balls 34 (shown in FIG. 7) adhere or wet to the entire diameter 50 of the conductive pads 14, 18. As a result, the equilibrium height of the pad-defined solder joints 40 is slightly less than that of the mask-defined solder joints 42.

It is important to note that the equilibrium height H of the mask-defined solder joints 42 is typically greater than that of the pad-defined solder joints 40, for a given solder volume. Solder joints with greater equilibrium heights tend to be more compliant and less likely to fracture. However, stress concentrations occur at a plurality of discontinuities 54 of the mask-defined solder joints 42 (refer to FIG. 9), where the midsection 46 abruptly meets the cylindrical portions 48. These stress concentrations tend to reduce the fatigue life of mask-defined solder joints 42. In contrast, pad-defined solder joints 40 do not have the discontinuities 54 found in mask-defined solder joints 42, thereby eliminating stress concentrations within the pad-defined solder joints 40. Therefore, in order to increase the fatigue life of solder joints 38 a combination of mask-defined solder joints 42 and pad-defined solder joints 40 are used. In particular, pad-defined solder joints 40 eliminate the stress concentrations of the mask-defined solder joints 42. In addition, the mask-defined solder joints 42 increase the equilibrium height H of the pad-defined solder joints 40, making the pad-defined solder joints 40 more compliant. Therefore, by combining the attributes of the pad-defined solder joints and the mask-defined solder joints the fatigue life of the solder joints 38 within the BGA package 36 is increased.

It is recommended that approximately 80–90% of the solder joints 38 be mask-defined solder joints 42, while the remaining 10–20% be pad-defined solder joints 40. A majority of the solder joints 38 are mask-defined solder joints 42 because the pad-defined solder joints 40 tend to compress the mask-defined solder joints 42. This is attributable to the lower normal equilibrium height of the pad-defined solder joints. By utilizing a majority of mask-defined solder joints 42 the average height of the BGA package 36 is approximately equal to the equilibrium height H of a BGA package containing all mask-defined solder joints 42. Since the pad-defined solder joints 40 lack the stress concentrations present within the mask-defined solder joints 42, the pad-defined solder joints 40 should be selectively placed in the high stress regions, such as beneath the corners and edges of the chip 11 or at the corners or edges of the BGA package 36.

It is important to note that the accompanying figures do not depict the placement of pad-defined solder joints selectively placed at the corners and edges of the chip 11 only for the simplicity of the disclosure. However, it should be understood that the present invention includes the use of pad-defined solder joints at the corners and edges of the chip 11, as well as any other high stress locations within the BGA package.

It is important to note that while the present invention was described wherein both the module and the board had masks with identical openings, the invention is not limited to the example in this disclosure. It is possible that only one side of the BGA package, either the module or the board, be masked having a combination of pad-defined and mask-defined solder joint openings, while the other side uses solely pad-defined or mask-defined solder joints. Likewise, both sides may be masked but it is not necessary that the openings at corresponding conductive pads be identical, etc. There are vast combinations of solder joints within the BGA package 36 which are not to be considered limited by this disclosure.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method of forming Ball Grid Array (BGA) interconnections, comprising the steps of:

providing a first substrate and a second substrate, each having a plurality of conductive pads mounted thereon; and applying a first mask to the first substrate and a second mask to the second substrate, wherein a first plurality of openings of the first and second masks expose selected conductive pads and have a diameter larger than a diameter of the conductive pads, and a second plurality of openings of the first and second masks expose selected conductive pads and have a diameter smaller than a diameter of the conductive pads.

2. The method of claim 1, further comprising the steps of:

applying a solder paste to the plurality of conductive pads within the first and second plurality of openings of the first mask of the first substrate and the second mask of the second substrate;

placing the conductive pads of the first substrate in a frame having solder balls therein;

reflowing the solder balls onto the conductive pads within the first and second plurality of openings of the first mask on the first substrate;

removing the first substrate, having solder balls attached thereto, from the frame;

aligning the plurality of conductive pads within the first and second plurality of openings of the second mask of the second substrate with the plurality of solder balls attached to the conductive pads within the first and second plurality of openings of the first mask of the first substrate; and reflowing the solder balls.

3. The method of claim 1, wherein the first and second plurality of openings of the first and second masks having a diameter larger than the diameter of the conductive pads are located in high stress regions of the first and second substrates.

4. The method of claim 3, wherein the high stress regions of the first and second substrates are at the corners and/or edges of the first and second substrates.

5. The method of claim 3, wherein the high stress regions of the first and second substrates are at the corners and/or edges of a chip within the BGA package.

6. The method of claim 1, wherein the first and second plurality of openings of the first and second masks having a diameter smaller than the diameter of the conductive pads are located in low stress regions of the first and second substrates.

7. The method of claim 3, wherein the BGA interconnections are vertically elongated in the high stress regions.

8. The method of claim 1, wherein the plurality of conductive pads are copper.

9. The method of claim 1, wherein the first substrate is a circuit board.

10. The method of claim 1, wherein the second substrate is a chip carrier having an integrated circuit chip attached thereto.

11. The method of claim 1, wherein the first and second masks comprise a non-wettable material.

12. The method of claim 11, wherein the non-wettable material is an epoxy.

13. The method of claim 2, wherein the frame is a graphite boat.

14. The method of claim 2, wherein the solder balls are the same size and have the same volume.

15. The method of claim 1, wherein approximately 80–90% of the openings of the first and second masks have a diameter smaller than a diameter of the conductive pads, and approximately 10–20% of the openings of the first and second masks have a diameter greater than a diameter of the conductive pads.

16. A method of forming Ball Grid Array (BGA) interconnections having mixed solder profiles, comprising the steps of:

providing a first substrate and a second substrate;

applying a mask to at least one of the first and second substrates, wherein a plurality of openings in the mask produce pad-defined solder joints and a plurality of openings in the mask produce mask-defined solder joints.

17. The method of claim 16, further including the steps of:

applying solder to the openings of the mask;

reflowing the solder onto the first and second substrates.

18. The method of claim 16, wherein the plurality of openings in the mask producing pad-defined solder joints are selectively located in high stress areas of the first and second substrates.

* * * * *